(12) United States Patent
Nardi et al.

(10) Patent No.: US 9,018,037 B1
(45) Date of Patent: Apr. 28, 2015

(54) VERTICAL OXIDE-OXIDE INTERFACE FOR FORMING-FREE, LOW POWER AND LOW VARIABILITY RRAM DEVICES

(71) Applicant: Intermolecular, Inc., San Jose, CA (US)

(72) Inventors: Federico Nardi, Palo Alto, CA (US);
Randall J. Higuchi, San Jose, CA (US);
Robert A. Huertas, Hollister, CA (US);
Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/098,263

(22) Filed: Dec. 5, 2013

(51) Int. Cl.
*H01L 29/02* (2006.01)
*H01L 45/00* (2006.01)

(52) U.S. Cl.
CPC .............. *H01L 45/145* (2013.01); *H01L 45/16* (2013.01)

(58) Field of Classification Search
CPC ......... H01L 45/04; H01L 29/00; H01L 27/24; G11C 13/0004

USPC ........... 257/2–5, E29.002; 438/102–104, 382
See application file for complete search history.

(56) References Cited

U.S. PATENT DOCUMENTS

| | | | |
|---|---|---|---|
| 7,442,603 B2 | 10/2008 | Lai et al. | |
| 8,686,389 B1 * | 4/2014 | Wang et al. | 257/2 |
| 8,835,890 B2 * | 9/2014 | Hsueh et al. | 257/2 |
| 8,852,996 B2 * | 10/2014 | Wang et al. | 438/102 |
| 2008/0121861 A1 * | 5/2008 | Lai et al. | 257/4 |
| 2011/0193050 A1 * | 8/2011 | Takano et al. | 257/4 |
| 2011/0315543 A1 * | 12/2011 | Hu et al. | 204/192.21 |
| 2013/0009128 A1 * | 1/2013 | Ribeiro et al. | 257/9 |
| 2013/0010529 A1 * | 1/2013 | Hayakawa et al. | 365/148 |

* cited by examiner

*Primary Examiner* — Jami M Valentine

(57) ABSTRACT

Forming a resistive switching layer having a vertical interface can generate defects confined along the interface between two electrodes. The confined defects can form a pre-determined region for filament formation and dissolution, leading to low power resistive switching and low program voltage or current variability. In addition, the filament forming process of the resistive memory device can be omitted due to the existence of the confined defects.

12 Claims, 19 Drawing Sheets

Initial Forming ↓

↕ Operational Switching

Set Operation ↓

↕ Operational Switching

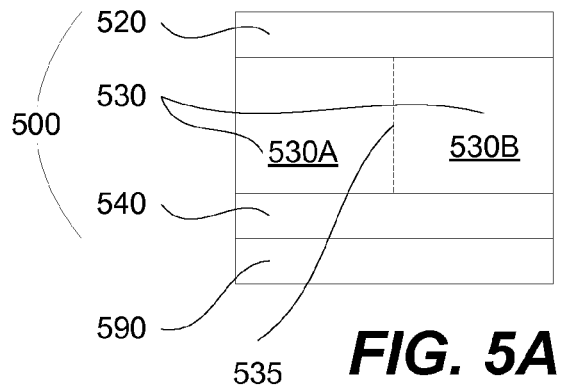 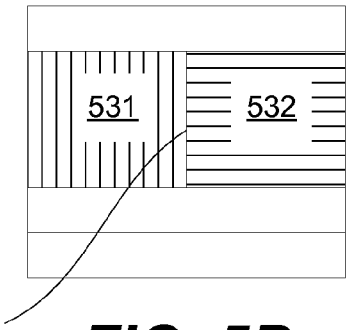
FIG. 5A   FIG. 5B
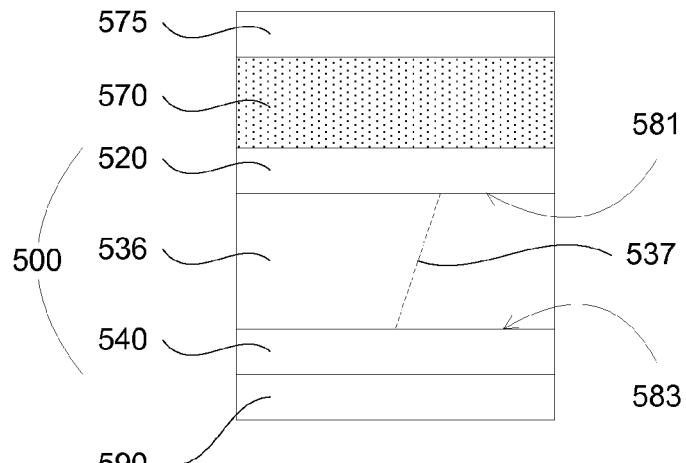
FIG. 5C
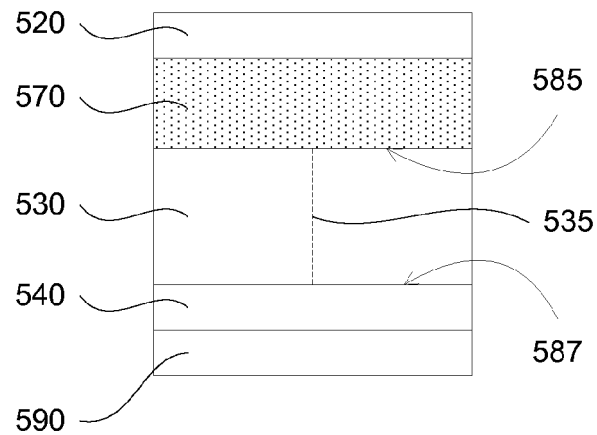
FIG. 5D

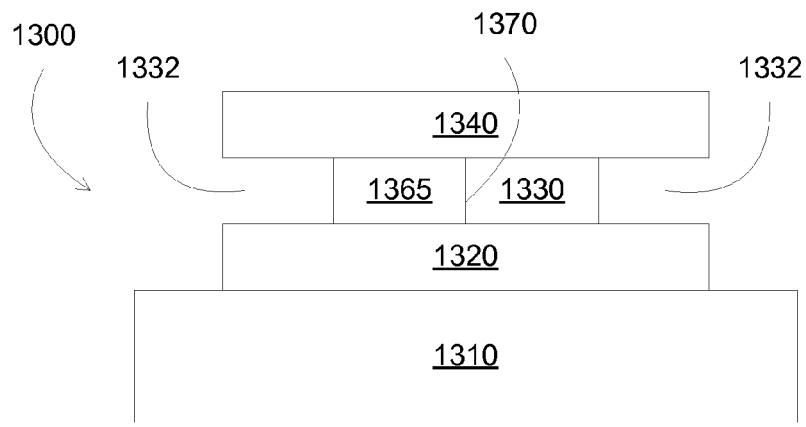
FIG. 13A
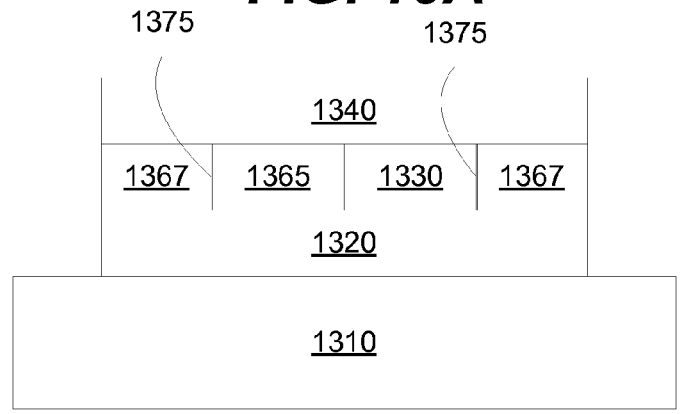
FIG. 13B
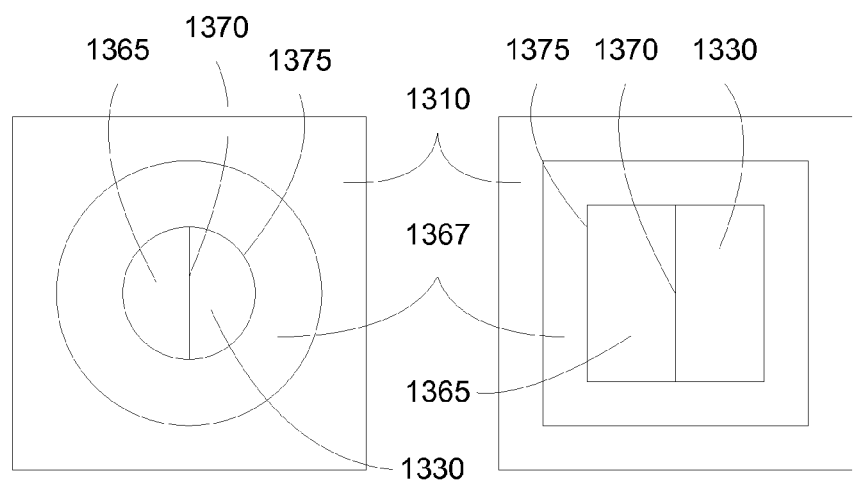
FIG. 13C  FIG. 13D

VERTICAL OXIDE-OXIDE INTERFACE FOR FORMING-FREE, LOW POWER AND LOW VARIABILITY RRAM DEVICES

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, there can still be issues related to the implementation of practical nonvolatile memory devices. For instance, a high power forming process is needed to create conductive filaments before the memory devices can be used. In addition, there can be significant variability in the programming voltages or programming currents, which are required to switch the resistance of the switching layer. Further, high power can be required for reset operation in resistive memory devices.

Therefore, there is a need for a memory device that can meet the design criteria for advanced memory devices.

SUMMARY

In some embodiments, methods and devices for forming resistive memory devices are provided. The memory structure can include an insulator layer disposed between two electrodes. The insulator layer can include an interface along a vertical direction connecting the two electrodes. The interface can be formed by multiple portions of resistive switching materials, placed in a lateral direction between the two electrodes.

In some embodiments, the defects in the insulator layer can be confined along the interface, which can facilitate the formation of conductive filaments between the electrodes. The confined defects can thus reduce or eliminate the forming process of the resistive memory formation, leading to power saving in the implementation of resistive memory devices. In addition, resistance switching, e.g., formation and dissolution of the conductive filaments, can be performed at lower power due to the presence of the confined defects. Further, the confined defects can reduce the uncertainty in the formation of the conductive filaments, leading to less variability in programming voltages or currents of the memory devices.

In some embodiments, the interface can be fabricated by a selective wet etch, removing a portion of the insulator layer. A second insulator layer can be deposited in the removal portion, leading to a switching layer having two portions with a vertical interface between the portions.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 5A-5D illustrate various configurations of a memory structure according to some embodiments.

FIGS. 13A-13D illustrate another process to form a memory structure according to some embodiments.

DETAILED DESCRIPTION

Figure 1A:
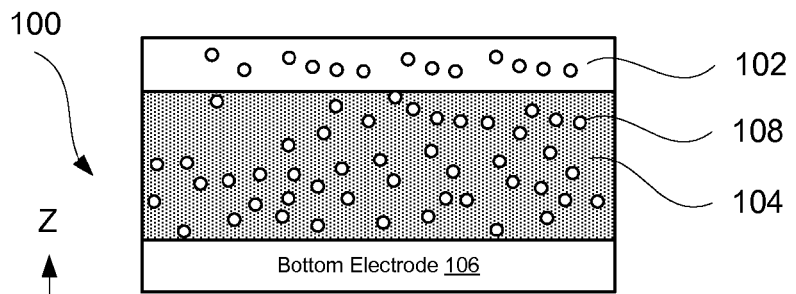
FIGS. 1A-1C illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and resistive memory devices are provided in which the resistive memory devices can be formed during the fabrication process. A vertical defect plane can be incorporated in the resistive switching layer of the memory devices, which can facilitate the change in resistance of the resistive switching layer.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and an inert electrode that generally does not participate in oxygen transfer. The inert electrode may be referred to as an oxygen-resistant electrode and may be made from titanium nitride, tantalum nitride, platinum, gold, and the like. Other suitable materials for inert electrodes include various conductive oxide, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium is one example of oxygen reactive materials, however other examples may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulator, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
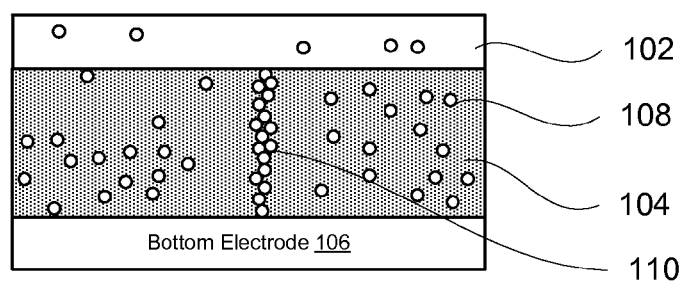
Figure 1C:
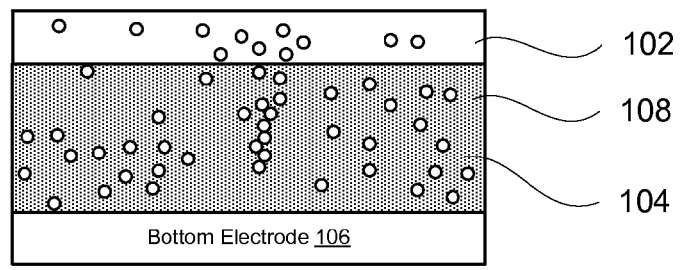

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices incorporating a ReRAM cell. As such, electrode 102 and 106 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types, all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching.

Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2:
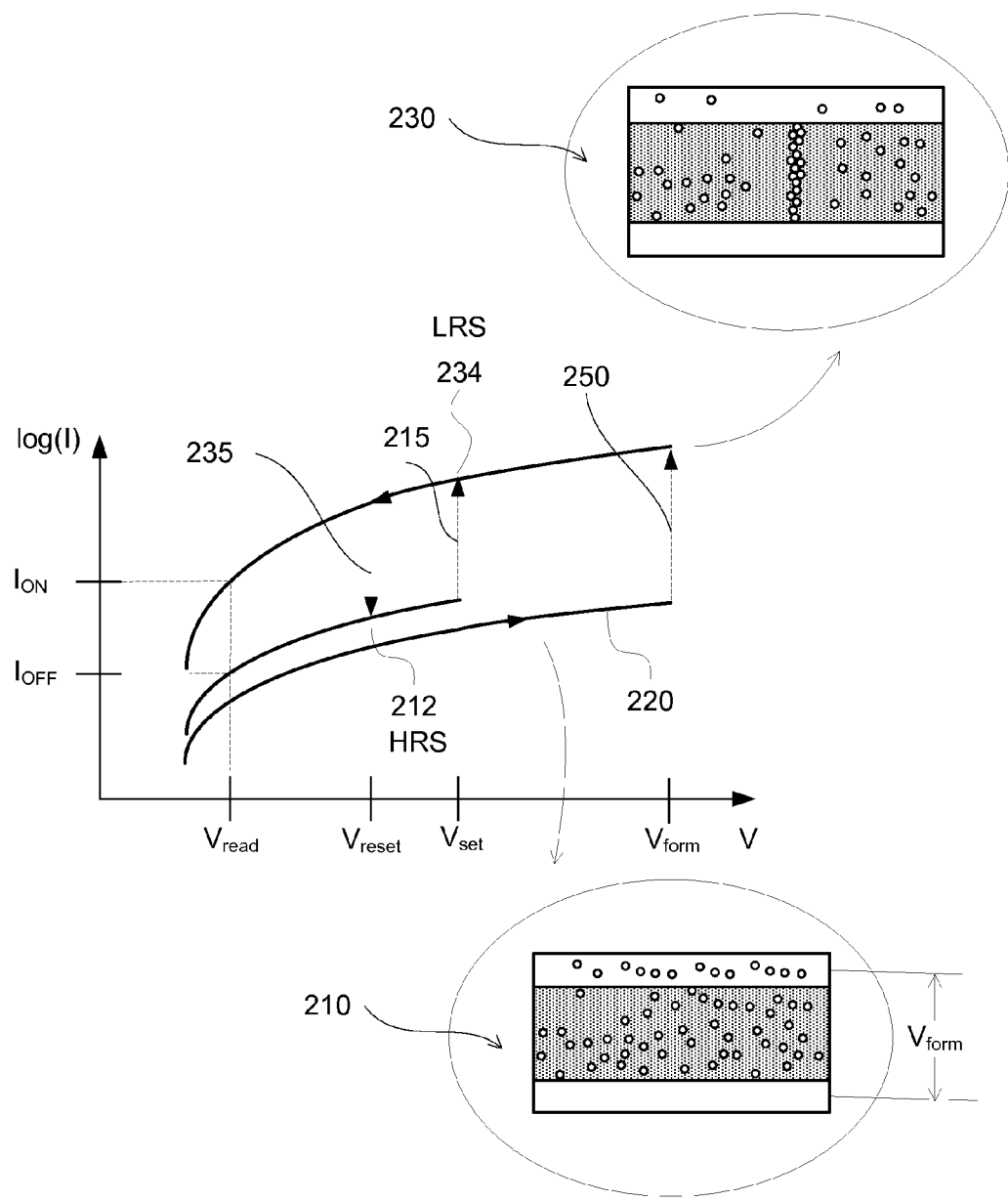
FIG. 2 illustrates a plot of a current passing through a unipolar ReRAM cell as a function of a voltage applied to the ReRAM cell according to some embodiments.

FIG. 2 illustrates a plot of a current passing through a unipolar ReRAM cell as a function of a voltage applied to the ReRAM cell according to some embodiments. A metal-insulator-metal (MIM) structure 210 can be first fabricated with an amount of defects embedded in the insulator layer. A voltage 220 can be applied to the MIM structure to form a resistive memory device from the MIM structure, for example, by making the insulator layer becoming a switching layer. By applying a forming voltage $V_{form}$, the randomly distributed defects can be transitioned 250 to lower resistance configurations, for example, in the form of filaments 230.

The lower resistance configurations can be characterized as a low resistance state (LRS) 234 for the resistive memory device, which persists even when the voltage is reduced. The LRS can represent a logic state of the memory device, such as a logic zero ("0").

At LRS, when another voltage, e.g., $V_{reset}$ is applied, the resistance can be transitioned 235 to a high resistance state (HRS), which persists even when the voltage is reduced. The HRS can represent another logic state of the memory device, such as a logic one ("1"). The reset voltage $V_{reset}$ is smaller than the forming voltage $V_{form}$.

At HRS, when another voltage, e.g., $V_{set}$ is applied, the resistance can be transitioned 215 back to the low resistance state (LRS), which persists even when the voltage is reduced. The set voltage $V_{set}$ is also smaller then the forming voltage $V_{form}$.

Overall, the ReRAM cell may be switched back and forth between its LRS and HRS many times. For example, when it is desired to turn "ON" the cell, e.g., to have a LRS, a set operation can be performed through the application of a set voltage $V_{set}$ to the electrodes. Applying the set voltage forms one or more conductive paths in the resistance switching layer as described above with reference to FIG. 1B. If it is desired to turn "OFF" the ReRAM cell, e.g., to change to HRS, a reset operation can be preformed through the application of a reset voltage $V_{reset}$ to the electrodes. Applying the reset voltage can destroy the conductive paths in the resistance switching layer as described above with reference to FIG. 1C.

The polarity of the reset voltage and the set voltage may be the same in unipolar memory devices, or may be different in bipolar devices (not shown). Without being restricted to any particular theory, it is believed that the resistive switching occurs due to filament formation and destruction caused by the application of electrical field.

Read operations may be performed in each of these states (between the switching operations) one or more times or not performed at all. During the read operation, the state of the ReRAM cell or, more specifically, the resistive state of its resistance of resistance switching layer can be sensed by applying a sensing voltage to its electrodes. The sensing voltage is sometimes referred to as a read voltage $V_{read}$.

In some embodiments, the set voltage $V_{set}$ is between about 100 mV and 10V or, more specifically, between about 500 mV and 5V. The length of set voltage pulses may be less than about 100 milliseconds or, more specifically, less than about 5 milliseconds and even less than about 100 nanoseconds. The read voltage $V_{read}$ may be between about 0.1 and 0.5 of the set voltage $V_{set}$. In some embodiments, the read currents ($I_{oN}$ and $I_{oFF}$) are greater than about 1 mA or, more specifically, is greater than about 5 mA to allow for a fast detection of the state by reasonably small sense amplifiers. The length of read voltage pulse may be comparable to the length of the corresponding set voltage pulse or may be shorter than the write voltage pulse. ReRAM cells should be able to cycle between LRS and HRS between at least about $10^3$ times or, more specifically, at least about $10^7$ times without failure. A data retention time should be at least about 5 years or, more specifically, at least about 10 years at a thermal stress up to 85° C. and small electrical stress, such as a constant application of the read voltage. Other considerations may include low current leakage, such as less than about 40 A/cm$^2$ measured at 0.5 V per 20 Å of oxide thickness in HRS.

In some embodiments, the switching layer can be fabricated with the defects confined in a vertical direction connecting the two electrodes. The confinement of the defects can eliminate the filament formation process, or at least reduce the power required during the forming process of the filaments. Further, the confinement of the defects can reduce the switching power, e.g., the power required to disconnect a conductive filament or the power required to re-connect a broken filament.

Figure 3A:
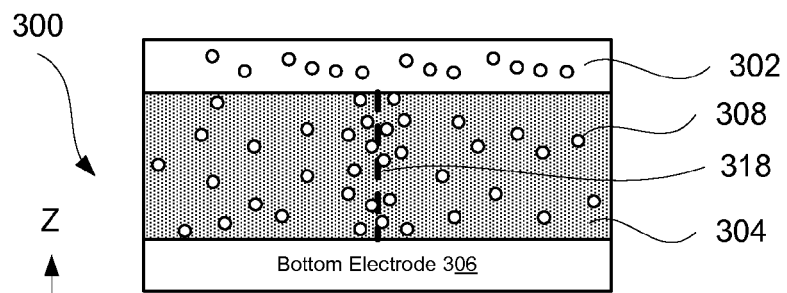
FIGS. 3A-3C illustrate a schematic representation of a ReRAM operation having confined defects according to some embodiments.
Figure 3B:
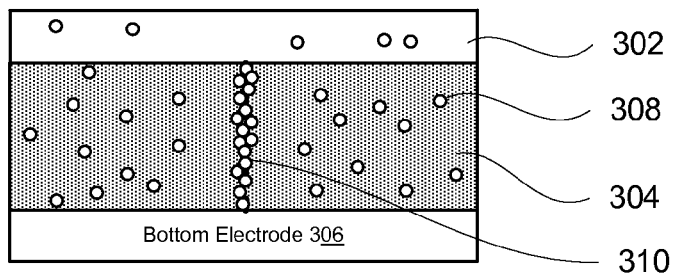
Figure 3C:
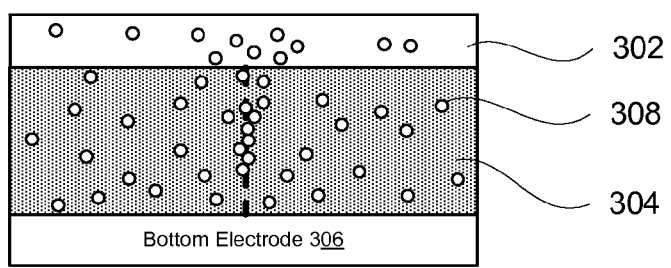

FIGS. 3A-3C illustrate a schematic representation of a ReRAM operation having confined defects according to some embodiments. A ReRAM cell 300 can include a resistance switching layer 304 provided between a top electrode 302 and a bottom electrode 306.

FIG. 3A shows a resistance switching layer 304 having defects 308, which can have a confined distribution in the vicinity of a plane 318 connecting the top and bottom electrodes. For example, by forming a layer 304 having a vertical interface plane, e.g., a plane not parallel to the electrode surfaces and intercepting both electrodes, the defect concentration can be higher at the interface, forming a confinement defect distribution. The interface can also be a line, and can be formed as a shortest distance between the two electrodes, such as a vertical plane or line along a normal direction of two parallel electrodes. In addition to be concentrated at the interface 318, the defects 308 can also be randomly distributed in the resistance switching layer 304.

The concentration of defects at the interface 318 can facilitate the formation of a conductive filament, for example, along a line in the interface plane. In some embodiments, the defect concentration can act as an initial filament, e.g., a conductive filament formed by an initial forming process. Thus the forming process for the resistive memory device can be omitted, resulting in power saving. For example, after the fabrication process of the memory device having the defect concentration 318, the memory device can be ready for operation. A set operation, e.g., an application of a set voltage to switch the layer 304 into a low resistance state, can be performed to change the state of the memory device. FIG. 3B shows the switching layer 304 after a set operation, aligning the defects into a conductive filament 310 between the two electrodes. Operation switching can be performed for changing the state of the resistive layer 304, e.g., a reset voltage can be applied to break the filament, bringing the layer 304 into a high resistance state (FIG. 3C).

Figure 4:
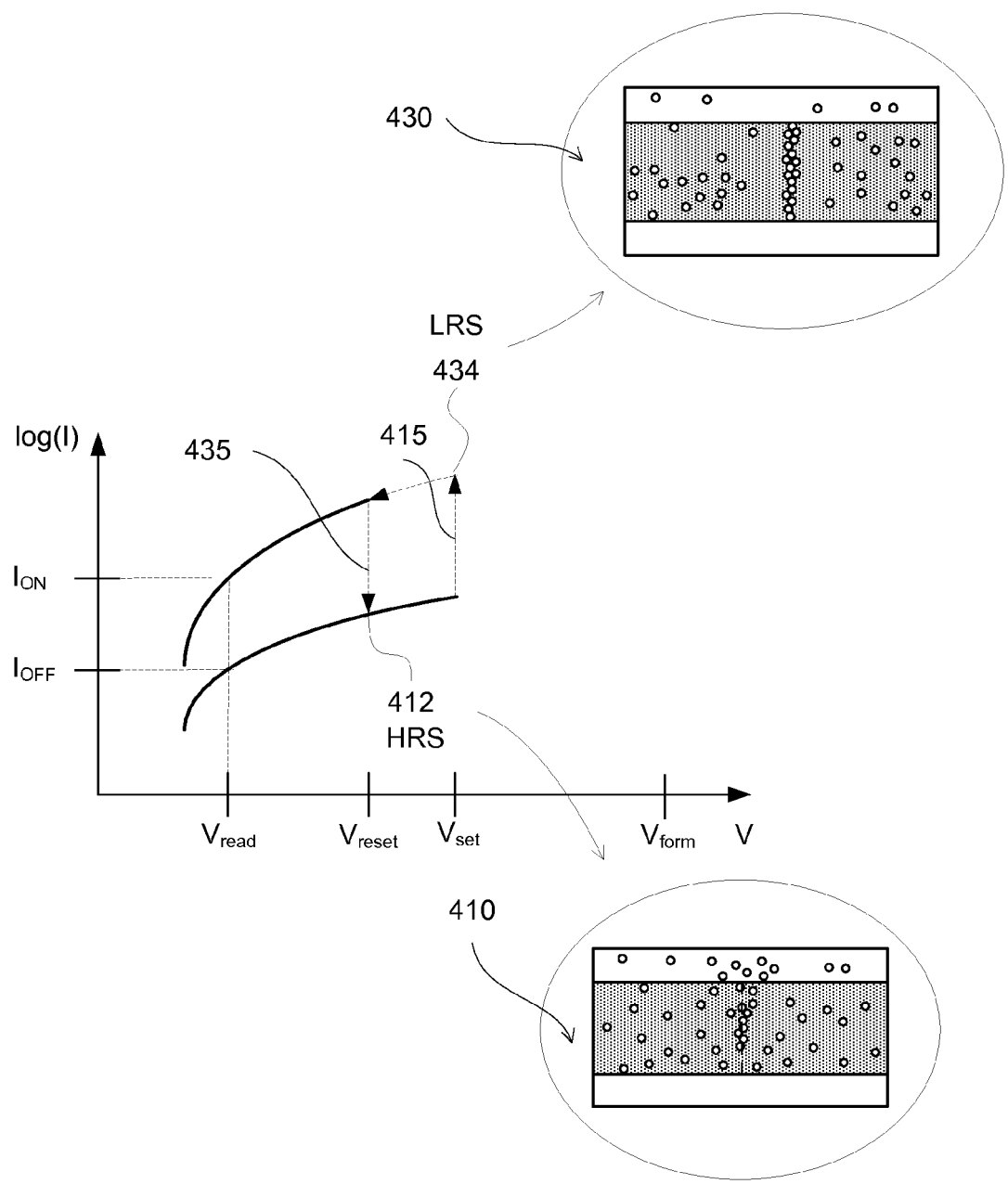
FIG. 4 illustrates a plot of a current passing through a unipolar ReRAM cell having a defect plane according to some embodiments.

FIG. 4 illustrates a plot of a current passing through a unipolar ReRAM cell having a defect plane according to some embodiments. A metal-insulator-metal (MIM) structure can be first fabricated with the insulator layer having a concentration of defects confined in a distribution along a direction connecting the top and bottom electrodes.

In some embodiments, the fabricated structure can have the defects forming a conductive distribution, resulting in a low resistance state (LRS) 434 MIM structure 430. When a reset voltage $V_{reset}$ is applied to the MIM structure 430, the resistance can be transitioned 435 to a high resistance state (HRS) 412, which can be characterized as a MIM structure 410 having a broken conductive defect distribution. A set voltage $V_{set}$ can be applied to the MIM structure 410, the resistance can be transitioned 415 to a low resistance state (LRS) 434, which can be characterized as a MIM structure 430 having a conductive defect distribution.

In some embodiments, the fabricated structure can also have the defects confined but forming a non-conductive distribution, resulting in a high resistance state (HRS) 412 MIM structure 410. When a set voltage $V_{set}$ can be applied to the MIM structure 410, the resistance can be transitioned 415 to a low resistance state (LRS) 434, which can be characterized as a MIM structure 430 having a conductive defect distribution. A reset voltage $V_{reset}$ is applied to the MIM structure 430, the resistance can be transitioned 435 to a high resistance state (HRS) 412, which can be characterized as a MIM structure 410 having a broken conductive defect distribution.

In some embodiments, the fabricated structure can also have the defects forming a confined distribution, which is quite suitable as a conductive distribution or a non-conductive distribution. A forming operation can be applied, e.g., applying a forming voltage, to generate a conductive distribution as shown in MIM structure 430 or a non-conductive distribution as shown in MIM structure 410.

In some embodiments, a metal-insulator-metal (MIM) structure is used for memory device applications. The insulator can be fabricated with an interface in between. The interface can form an angle with the plane of the electrodes, and can intercept the electrodes. The defects can be concentrated along the interface, and can form a conductive path between the two electrodes. The MIM structure having the interface can allow the formation of memory device without or with reduced-power forming process.

FIGS. 5A-5D illustrate various configurations of a memory structure according to some embodiments. Cross section views of a memory structure are shown, including a memory device 500 disposed on a substrate 590. The memory device can include a top electrode 520 disposed on an insulator layer 530, or 531/532 disposed on a bottom electrode 540. Other layers can be included, such as a current selector or a current limiter layer 570 and another electrode 575. The top electrode 520 can be disposed near the insulator layer 530. However, other configurations can be used, such as the top electrode 520 can be disposed on the current selector or current limiter layer 570.

In FIG. 5A, the insulator layer 530 can be separated by an interface 535. As shown, the interface is perpendicular to a lateral direction of the insulator layer 530, e.g., along the normal direction of an insulator plane. In general, the interface can be configured to intersect with the top electrode 520 and bottom electrode 540. Since the defects can be concentrated along the interface, an intersected interface can allow an electrical conduction between the two electrodes, for example, by the formation of a filament between the intersection with the top electrode and the intersection with the bottom electrode. The insulator layer 530 can include two portions 530A and 530B. Portion 530A can directly contact portion 530B. Portions 530A and 530B can directly contact the first electrode 520 and the second electrode 540. The two portions 530A and 530B can form interface 535, which forms a surface that is substantially perpendicular to the electrode 520 or 540, e.g., perpendicular to a lateral surface of the electrode 520 or 540.

The interface 535 can be formed between two same materials 530A and 530B of the insulator layer 530. In FIG. 5B, the interface 537 can be formed between two different materials. For example, the insulator layer can include two different portions 531 and 532, such as a left portion 531 and a right portion 532.

Other components can be included in the memory structure, such as a current steering element 570. In FIG. 5C, a current steering layer 570 can be disposed on the top electrode 520, together with an electrode 575 for the current steering layer 570. The insulator layer 536 can include two portions, which directly contact each other. The two portions also directly contact the electrodes 520 and 540. The two portions can form an interface 537, divides the insulator 536 into two portions, with each portion disposed between and contacting the electrodes 520 and 540. The interface 537 can form an angle surface with the electrode 520 or 540, e.g., the surface of the interface is not perpendicular to the lateral surface of the electrode 520 or 540. The two portions can be made of the same or different materials.

The insulator layer 530 can have a top lateral surface interfacing with a layer directly above the insulator layer. The insulator layer can have a bottom lateral surface interfacing with a layer directly below the insulator layer. For example, if the insulator layer 530 is formed on a bottom electrode 540, the insulator layer can have a bottom lateral surface 583 that interfaces with the bottom electrode 540. If the insulator layer 530 is formed under a top electrode 520, the insulator layer can have a top lateral surface 581 that interfaces with the top electrode 520.

In FIG. 5D, a current steering layer 570 can be disposed on the insulator 530, sharing the electrode 520 with the insulator layer 530. The interface 535 divides the insulator 530 into two parallel portions, with each portion disposed between the electrodes 520 and 540. The portions can be connected, e.g., having an interface, with electrode 540 and with the current steering layer 570. The two portions can be made of the same or different materials.

The insulator layer 530 can have a top lateral surface interfacing with a layer directly above the insulator layer. For example, if the insulator layer is formed under a current steering layer 570, the insulator layer 530 can have top lateral surface 585 that interfaces with the current steering layer 570. The insulator layer can have a bottom lateral surface interfacing with a layer directly below the insulator layer. For example, if the insulator layer 530 is formed on a bottom electrode 540, the insulator layer can have a bottom lateral surface 587 that interfaces with the bottom electrode 540.

In some embodiments, the insulator layer can include a layer of $TiO_2$, $HfO_2$, $ZnO_2$, strontium titanate (STO), indium gallium zinc oxide (IGZO), or $SnO_2$. The insulator layer can include a transition metal oxide. The insulator layer can have multiple lateral portions, e.g., parallel portions between two electrodes.

The thickness of the insulator layer can be between 5 and 25 nm. The electrodes can include Pt, Ru, Ti, TiN, Ag, Ni, Co, an alloy of these elements, or a conductive metal oxide of these elements. The two electrodes can have same composition elements, e.g., both electrodes can include Pt, or can have different composition elements, e.g., one electrode can include Pt and the other electrode Ru. The electrodes can have any thickness, such as between 5 and 500 nm.

Figure 6A:
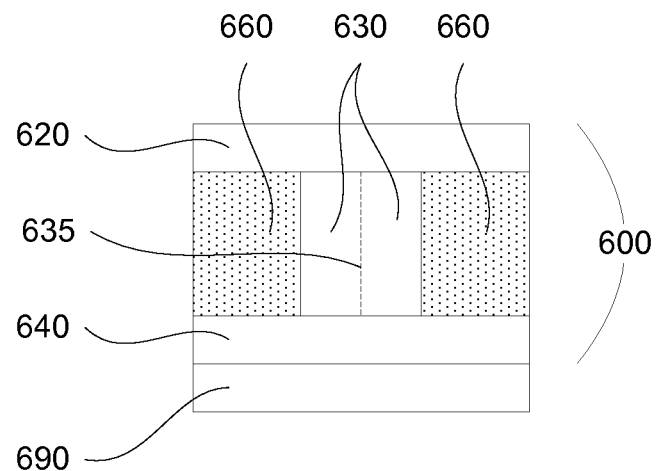
FIGS. 6A-6B illustrate other configurations of a memory structure according to some embodiments.
Figure 6B:
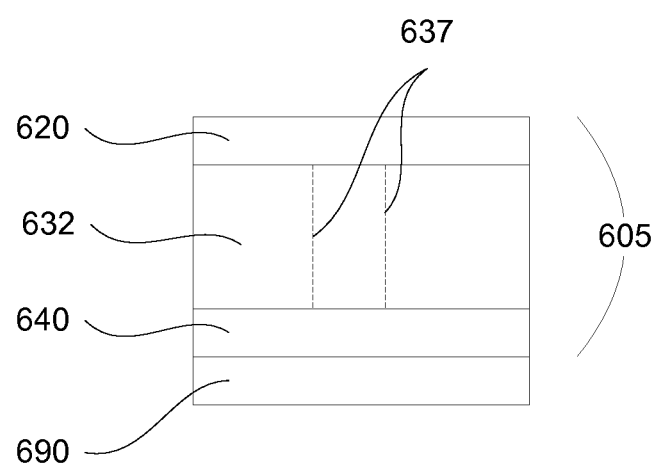

FIGS. 6A-6B illustrate other configurations of a memory structure according to some embodiments. In FIG. 6A, a cross section views of a memory structure are shown, including a memory device 600 disposed on a substrate 690. The memory device can include a top electrode 620 disposed on an insulator layer 630, which is disposed on a bottom electrode 640. The insulator layer 630 can have an interface 635, which divides the insulator layer 630 into two lateral portions, with each portion disposed between and contacting the electrodes 620 and 640. The insulator layer 630 can include a metal oxide material, which is operable as a switching layer. Other portions 660 can be included between the two electrodes, which can be made from non-switching material. For example, the layer between the two electrodes 620 and 640 can include switching layer material portions 630 and non-switching layer material portions 660. The non-switching material portions 660 can be used to reduce the size of the switching layer portions 630, for example, to reduce the variability of the interface 635, leading to a more controllable conductive filament. The two portions of the switching layer portions 630 can be made of the same or different materials. The two portions of the non-switching layer portions 660 can be made of the same or different materials.

Other layers can be included, such as a current selector or a current limiter layer 670 and another electrode 675. The top electrode 620 can be disposed near the insulator layer 630. However, other configurations can be used, such as the top electrode 620 can be disposed on the current selector or current limiter layer 670.

In FIG. 6B, a cross section views of a memory structure are shown, including a memory device 605 disposed on a substrate 690. The memory device can include a top electrode 620 disposed on an insulator layer 632, which is disposed on a bottom electrode 640. The insulator layer 632 can have multiple interfaces 637, which divides the insulator layer 632 into multiple lateral portions, with each portion disposed between and contacting the electrodes 620 and 640. The insulator layer 630 can include a metal oxide material, which is operable as a switching layer. The two portions of the switching layer portions 632 can be made of the same or different materials.

Other configurations can be included, such as non-switching material portions 660 as shown above. Further, other layers can be included, such as a current selector or a current limiter layer 670 and another electrode 675. The top electrode 620 can be disposed near the insulator layer 630. However, other configurations can be used, such as the top electrode 620 can be disposed on the current selector or current limiter layer 670.

In some embodiments, methods and memory structure fabricated from the methods, are provided including forming a defect concentration in a switching layer that can form a conductive path between two electrodes. The defect concentration can be prepared by forming an interface in the switching layer that runs from a lateral surface to an opposite lateral surface of the switching layer.

Figure 7:
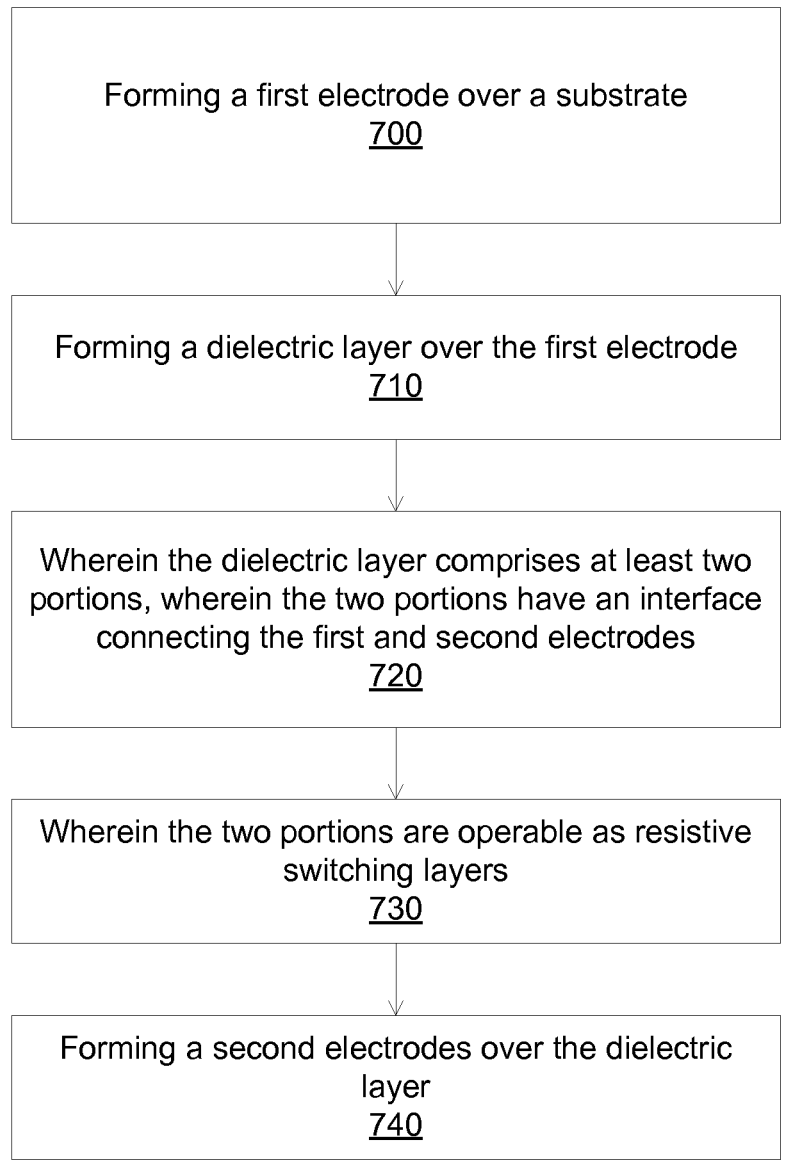
FIG. 7 illustrates a flowchart for forming a memory structure according to some embodiments.

FIG. 7 illustrates a flowchart for forming a memory structure according to some embodiments. The memory structure can include an insulator or dielectric layer disposed between two electrodes. The flowchart is a general description of techniques used to form the memory devices described above. The flowchart describes techniques for forming a memory device generally including two electrodes and one or more layers disposed there between. Although certain processing techniques and specifications are described, it is understood that various other techniques and modifications of the techniques described herein may also be used.

In operation 700, a first electrode layer can first be formed. The first electrode layer can be formed over a substrate, for example, a silicon substrate that may include one or more layers already formed thereon. In some embodiments, the first electrode layer can be a polysilicon layer or a metal containing layer. For example, the first electrode layer can be a highly doped polysilicon layer that is formed using a conventional chemical vapor deposition (CVD) or atomic layer deposition (ALD) type polysilicon deposition technique. In some cases, an optional native oxide layer removal step may be performed after forming the first layer by use of a wet chemical processing technique, or conventional dry clean process that is performed in a plasma processing chamber. It should be noted that the first electrode layer may be provided on a substrate that may have a resistive memory element and the electrode formed thereon as well. Alternatively, in the case where no other device is provided, the first electrode layer can be the bottom electrode. The first electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. For example, the first electrode can be sputtered by bombarding a metal target at 150-500W with a pressure of 2-10 mTorr for a deposition rate of approximately 0.5-5Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, pulsed layer deposition (PLD), physical vapor deposition (PVD), CVD, evaporation, etc. can also be used to deposit the first electrode. In some embodiments, the first electrode is in contact with one of the signal lines. The first electrode may have any thickness, for example between about 5 nm and about 500 nm thick.

In operation 710, an insulator or dielectric layer can be formed over the first electrode. The insulator layer can include $ZrO_2$, $HfO_2$, or $Al_2O_3$. The thickness of the insulator layer can be between 3 nm and 30 nm.

In some embodiments, the insulator layer can have an interface along a direction not parallel to a lateral surface of the insulator layer. The interface can be a plane, a surface or a line that separates the insulator layer into multiple lateral portions. The interface can be disposed between the top and bottom lateral surfaces of the insulator layer, e.g., a top end of the interface intersects the top lateral surface and a bottom end of the interface intersects the top lateral surface.

In some embodiments, the insulator can have at least two lateral portions. Each lateral portion can include a portion of the top lateral surface and a portion of the bottom lateral surface of the insulator layer. The multiple lateral portions can have interfaces between them. The multiple portions can be operable as switching layer, e.g., formed from metal oxide materials having embedded defects. The interface between the multiple portions can have a concentration of defects, which can act as conductive filaments, and thus can allow the omission or the reduction of the forming process. For example, the insulator layer with the interface can be operable as a switching layer without the need for a forming process.

An optional treatment can be performed after depositing the insulator layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the insulator layer can be deposited by a PVD or ALD process. For example, an ALD process can include $O_3$ oxidant, at about 250-300 C deposition temperature, using tetrakis (ethylmethylamino) zirconium (TEMAZ), Tris (dimethylamino) cyclopentadienyl Zirconium, tetrakis (ethylmethylamino) hafnium (TEMAHf), tetrakis (dimethylamido) hafnium (TDMAHf) precursors.

In operation 740, a second electrode layer can be formed over the dielectric or insulator layer. The second electrode layer can include TiN, TaN, Ni, Pt, or Ru. Other elements can also be used, such as Ti, Al, MoO$_2$, W, poly-Si, TiSiN, TaSiN, or any combination, mixture or alloy thereof that can be formed using PVD or other processes. The second electrode can have any thickness, for example between about 5 nm and about 500 nm thick. Additional layers can be added, such as layers for a current selector or a current limiter device. Alternatively, the additional layers can be formed under the dielectric layer or under the first electrode.

After fabrication, the memory structure can be ready for operation, e.g., storing information by switching operations without a forming process. Alternatively, a forming voltage can be applied to the two electrodes of the memory structure. The forming voltage can form conductive filaments from the defect distribution, for example, by re-arrange the defect distribution in the insulator layer, such as from a confined distributed defect configuration to a filament distributed defect formation. With the confined defect configuration formed by the interface, the forming voltage and power can be less as compared to a memory structure without the interface defect distribution.

FIGS. 8A-8H illustrate a fabrication process for forming a memory structure having an interface according to some embodiments. The described process is a general description of techniques used to form the memory devices described above. Although certain processing techniques and specifications are described, it is understood that various other techniques and modifications of the techniques described herein may also be used.

Figure 8A:
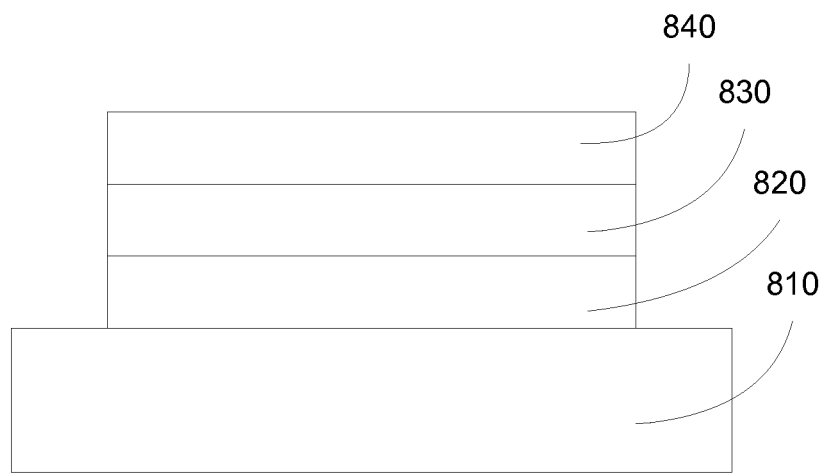
FIGS. 8A-8H illustrate a fabrication process for forming a memory structure having an interface according to some embodiments.

In FIG. 8A, a top electrode 840 can be formed ever a dielectric layer 830, which can be formed over a bottom electrode 820, which can be formed over a substrate 810. The dielectric layer 830 can be a metal oxide, such as hafnium oxide or zirconium oxide. The dielectric layer can be operable as a switching layer, e.g., having embedded defects that can be re-distributed to form conductive filaments. A patterning process can be performed, for example by a photolithography process followed by a etch process, to pattern the memory stack, e.g., the dielectric layer between the two electrodes. Other process steps and components can be added, for example, a cleaning step and device isolation.

Figure 8B:

In FIG. 8B, a protective layer 850 can be formed over the memory stack. The protective layer can be operable to protect a portion of the memory stack, or can be operable as a mask for removing a portion of the memory stack. The protective layer can include a dielectric layer, such as an oxide layer. The protective layer can include other materials, such as a photoresist layer.

Figure 8C:

In FIG. 8C, the protective layer 850 is patterned to form a patterned protective layer 855. The patterned protective layer 855 can be configured to expose a surface of the dielectric layer 830, such as a surface between the two electrodes 820 and 840. The patterning of the protective layer 850 can be performed by a photolithography process.

Figure 8D:
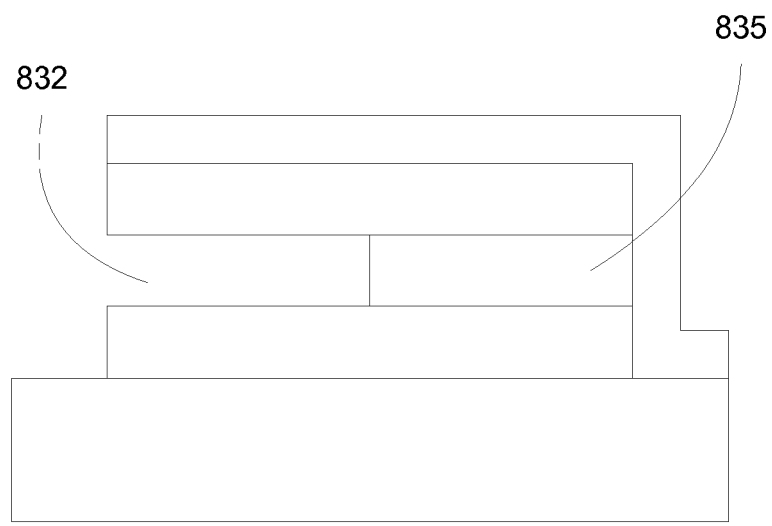

In FIG. 8D, the dielectric layer is selectively etched. For example, as shown in the figure, a portion of the surfaces of the dielectric layer and the two electrodes are exposed by the patterned protective layer 855. In this configuration, the dielectric layer can be selectively etched with respect to the two electrodes to remove a lateral portion and to form an opening 832 of the dielectric layer. The selective etch can be a wet etch, for example, using a solution of HF and HCl.

Figure 8E:
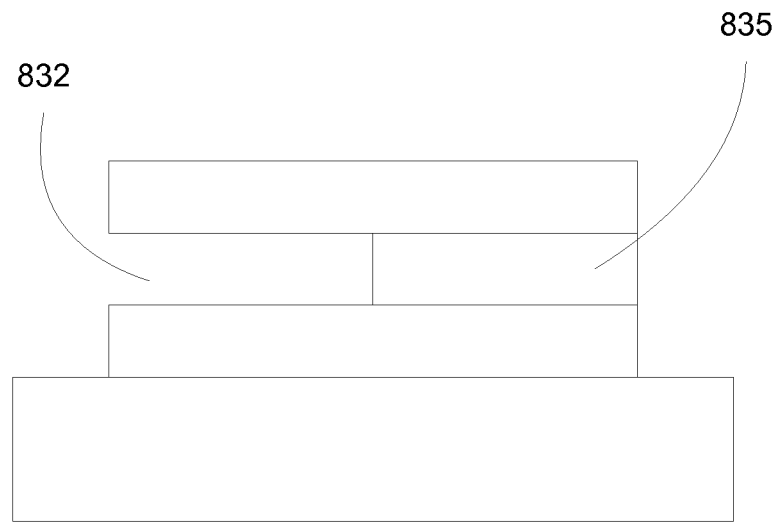

In FIG. 8E, the patterned protective layer 855 is removed, for example, by a wet etch process. The removal of the protective layer 855 can be performed layer, for example, after filling the opening 832 as shown in the next step.

Figure 8F:
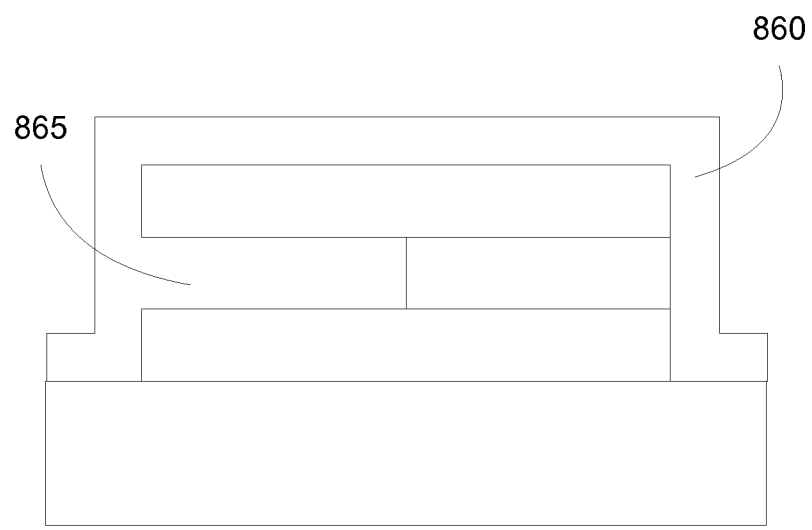

In FIG. 8F, a dielectric layer 860 is formed, filling in the opening 832. A portion 865 of the dielectric layer 860 can fill the opening 832. The formation of the dielectric layer 860 can be performed by a deposition process that has good gap fill characteristics, such as an atomic layer deposition (ALD) process, to fill the opening 832. The dielectric layer 860 can be a metal oxide layer, such as hafnium oxide or zirconium oxide. The dielectric layer 860 can be operable as a switching layer, e.g., having embedded defects that can be re-distributed to form conductive filaments.

In some embodiments, the dielectric layer 860 can have the same elements as the dielectric layer 830, e.g., the same materials and compositions. The interface between the layers 830 and 860 can be considered as an internal interface, e.g., an interface within a same material.

In some embodiments, the dielectric layer 860 can be different than the dielectric layer 830, e.g., the two layers can have different materials and/or compositions. The interface between the layers 830 and 860 can be considered as an external interface, e.g., an interface between two different materials.

Figure 8G:
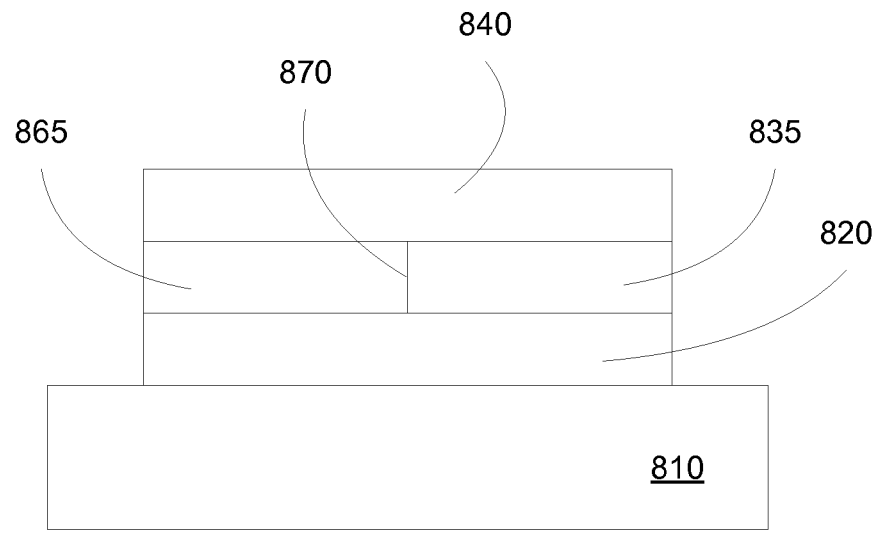

In FIG. 8G, the dielectric layer 860 can be etched, for example, by a directional or anisotropic etch, to remove the portion of the dielectric layer outside the opening. The anisotropic etch can include a plasma etch, for example, a reactive plasma etch with fluorine, chlorine, or oxygen etchant. After the anisotropic etch, the memory structure can include two electrodes 820 and 840, and a layer of switching material that has two lateral portions 865 and 835. The switching layer 865/835 has an interface 870 between the two lateral portions 865 and 835, which can have a high concentration of defects, e.g., to form a conductive path of defects between the two electrodes. The conductive path can facilitate the formation of conductive filaments, which can change the resistance state of the switching layer 865/835.

Figure 8H:
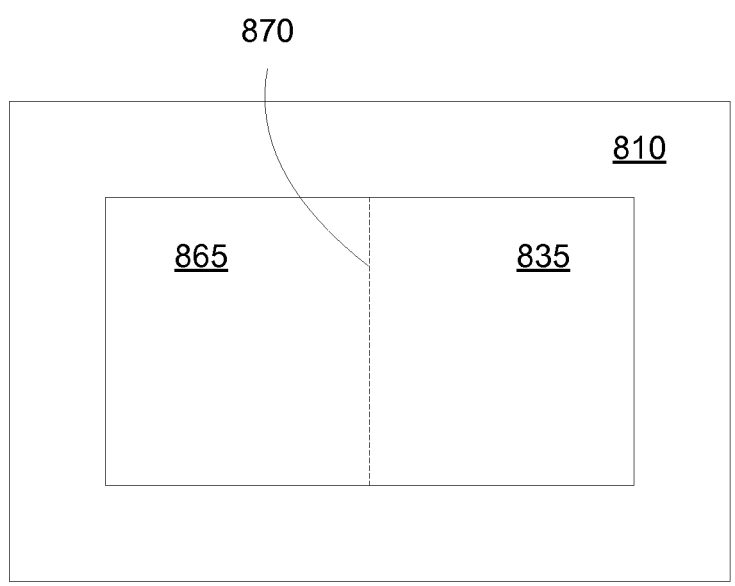

FIG. 8H shows a top view of the memory structure, showing that the memory structure has a rectangular shape, with the interface 870 dividing the switching layer 865/835 into two lateral portions 865 and 835. Other structure shapes and interfaces can also be implemented, such as circular structures or line interfaces.

Figure 9:
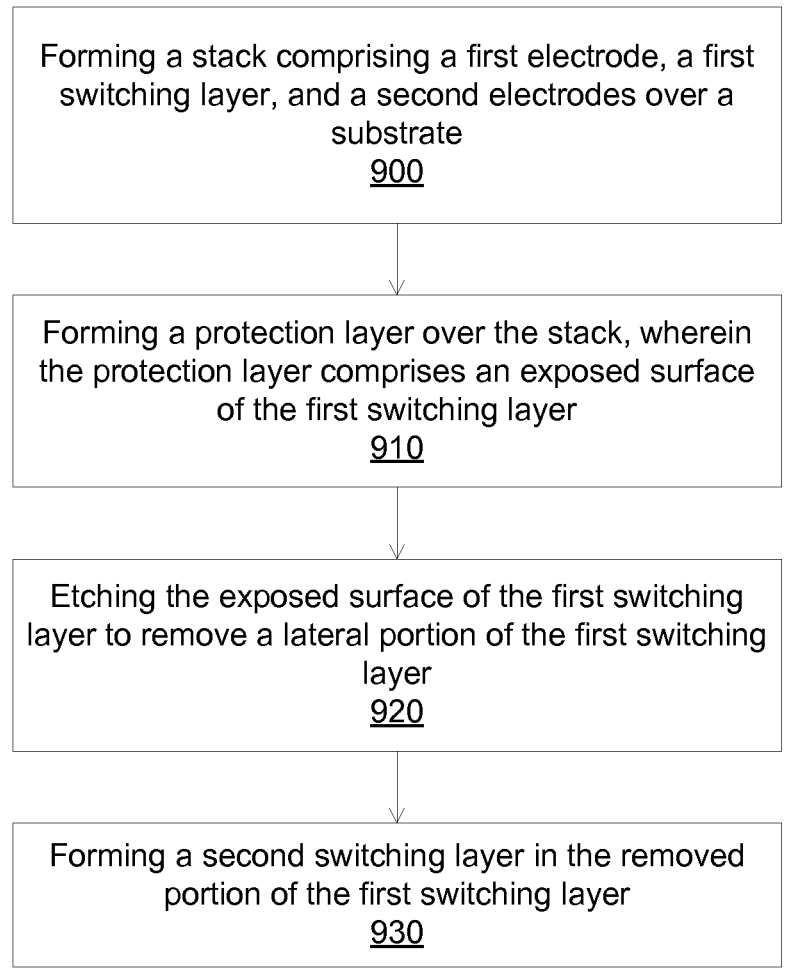
FIG. 9 illustrates another flowchart for forming a memory structure according to some embodiments.

FIG. 9 illustrates another flowchart for forming a memory structure according to some embodiments. In operation 900, a memory stack can be formed, which can include forming a first insulator or dielectric layer disposed between first and second electrodes. The first dielectric layer can operable as a switching layer, and can include a metal oxide such as hafnium oxide or zirconium oxide. The formation of the memory stack can include a sequential deposition of the first electrode, the dielectric layer, and the second electrode over a substrate, as discussed above.

In operation 910, a protective layer is formed over the memory stack. The protective layer can include an exposed surface of the first dielectric layer between the two electrodes. The protective layer can be formed by a deposition process, followed by a masking process and an anisotropic etch to expose a side wall of the memory stack.

In operation 920, the exposed surface of the first dielectric layer is etched to remove a portion of the first dielectric layer. The etching process can be an isotropic wet etch to remove a portion of the first dielectric material between the first and second electrodes. The etching process can be a selective etch, which can remove the first dielectric material without affecting or etching the electrodes.

In operation 930, a second dielectric layer is formed in the removed portion of the first dielectric layer. The formation of the second dielectric layer can be performed by a high gap fill deposition process, such as an atomic layer deposition process. The excess material outside the opening, e.g., the removed portion of the first dielectric layer, can be removed, for example, by an anisotropic etch such as a plasma etch.

In some embodiments, the switching layer can have multiple interfaces in a vertical direction, e.g., a direction that is not parallel to the lateral direction of the switching layer. Each interface can be formed between two lateral portions of the switching layer. In some embodiments, the fabrication of the multiple interface switching layer can be similar, e.g., protecting other surfaces of the switching layer while exposing one surface of the switching layer, removing a portion of the switching layer, and re-filling with a same or different switching layer.

Figure 10A:
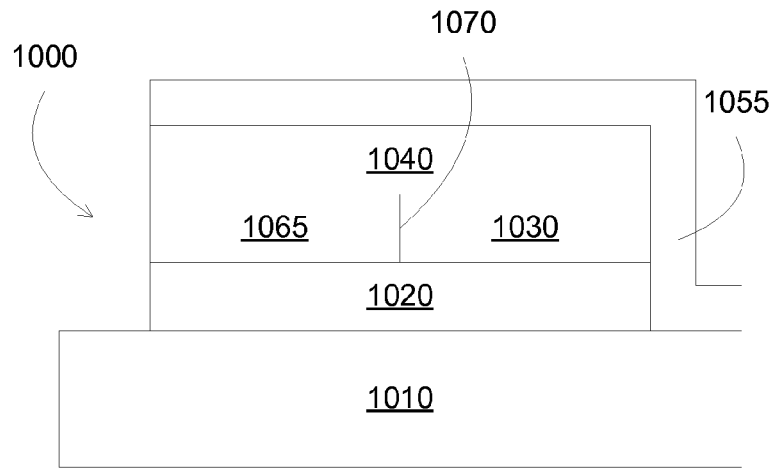
FIGS. 10A-10C illustrate a fabrication process for forming a memory structure having multiple interfaces according to some embodiments.
Figure 10B:
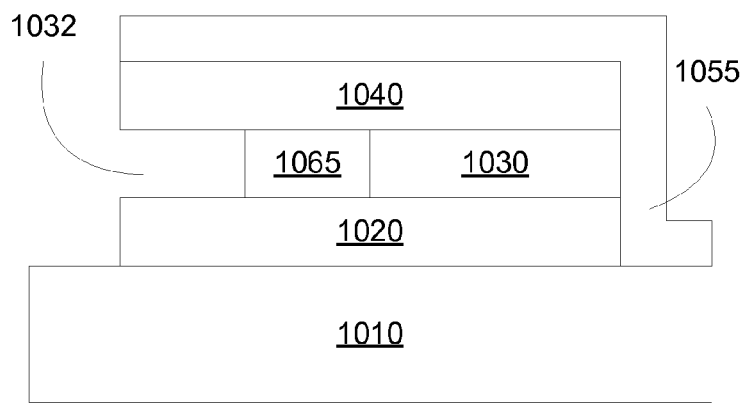
Figure 10C:
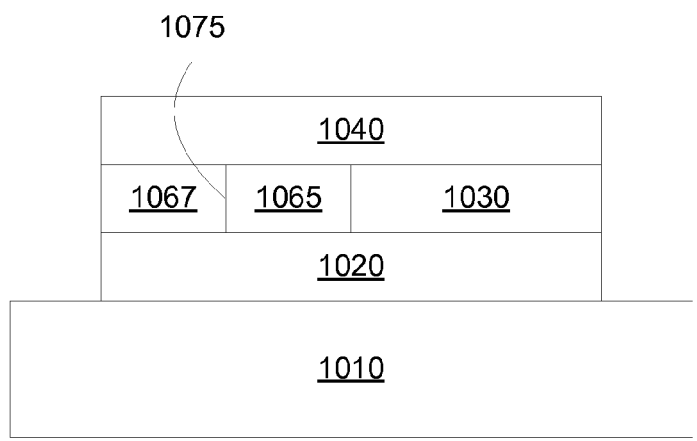

FIGS. 10A-10C illustrate a fabrication process for forming a memory structure having multiple interfaces according to some embodiments. A memory structure 1000 with the switching layer having one interface can be prepared, for example, by a process discussed above. The memory structure 1000 can include a switching layer 1065/1030 having interface 1070 between two lateral portions 1065 and 1030.

In FIG. 10A, a protective layer 1055 can be formed on the memory structure 1000. The protective layer 1055 can expose a portion of the lateral portion 1065 while covering the lateral portion 1030 and other layers, such as a top portion of electrode 1040. The protective layer 1055 can be formed by depositing a blanket layer on the memory structure, followed by a patterning process, including photolithography masking and etching. The protective layer can include an oxide material, such as silicon oxide, or a nitride layer, such as silicon nitride.

In FIG. 10B, the memory structure 1000 is exposed to an etch process, such as an isotropic wet etch process. The isotropic wet etch can remove a portion of the lateral portion 1065, creating an opening 1032.

In FIG. 10C, a dielectric layer 1067 is formed in the opening 1032. The dielectric layer 1067 can be a switching layer, which can generate a switching interface 1075, e.g., an interface that can have a high accumulation of defects on both sides of the interface. The device can have a second switching interface 1075, in addition to the original interface 1070, both of which can form conductive filaments when a set voltage is applied. The dielectric layer 1067 can be a non-switching layer, and thus the interface 1075 can have some accumulation of defects on the switching layer 1065 side, or does not have defects accumulated at the interface.

Figure 11A:
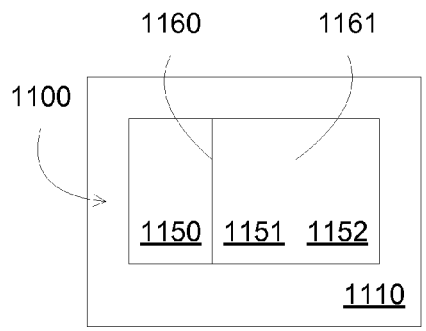
FIGS. 11A-11F illustrate top views of various configurations of memory structures having multiple interfaces according to some embodiments.
Figure 11B:
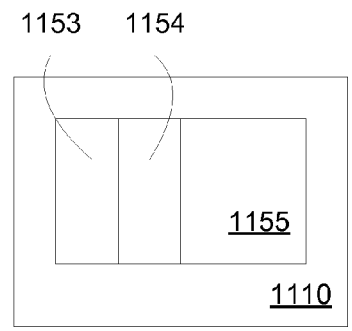
Figure 11C:
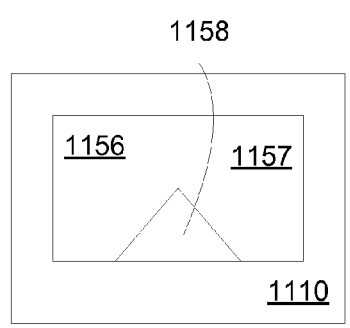
Figure 11D:
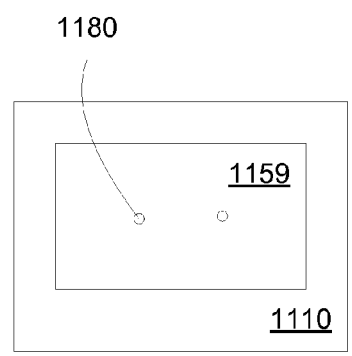
Figure 11E:
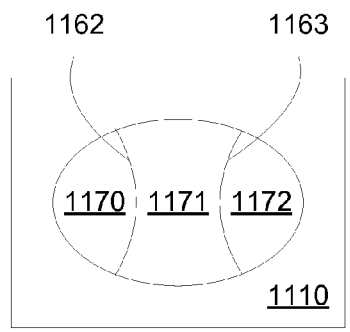
Figure 11F:
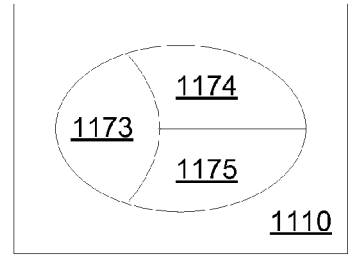

FIGS. 11A-11F illustrate top views of various configurations of memory structures having multiple interfaces according to some embodiments. In FIG. 11A, a switching layer 1100 can include three lateral portions 1150, 1151 and 1152 disposed on a substrate 1110. Between the lateral portions are the interfaces 1160 and 1161. The lateral portions can have rectangular shape with equal areas. In FIG. 11B, the switching layer can include three lateral portions 1153, 1154 and 1155 having different sizes. In FIG. 11C, the switching layer can include three lateral portions 1156, 1157 and 1158 having different sizes and shapes. In FIG. 11D, the interfaces can be in the form of interfacial lines 1180. In FIG. 11E, the lateral portions 1170, 1171 and 1172 can have irregular shapes with curved plane interfaces 1162 and 1163. In FIG. 11F, the lateral portions 1173, 1174 and 1175 can have irregular shapes with curved or straight plane interfaces.

Figure 12:
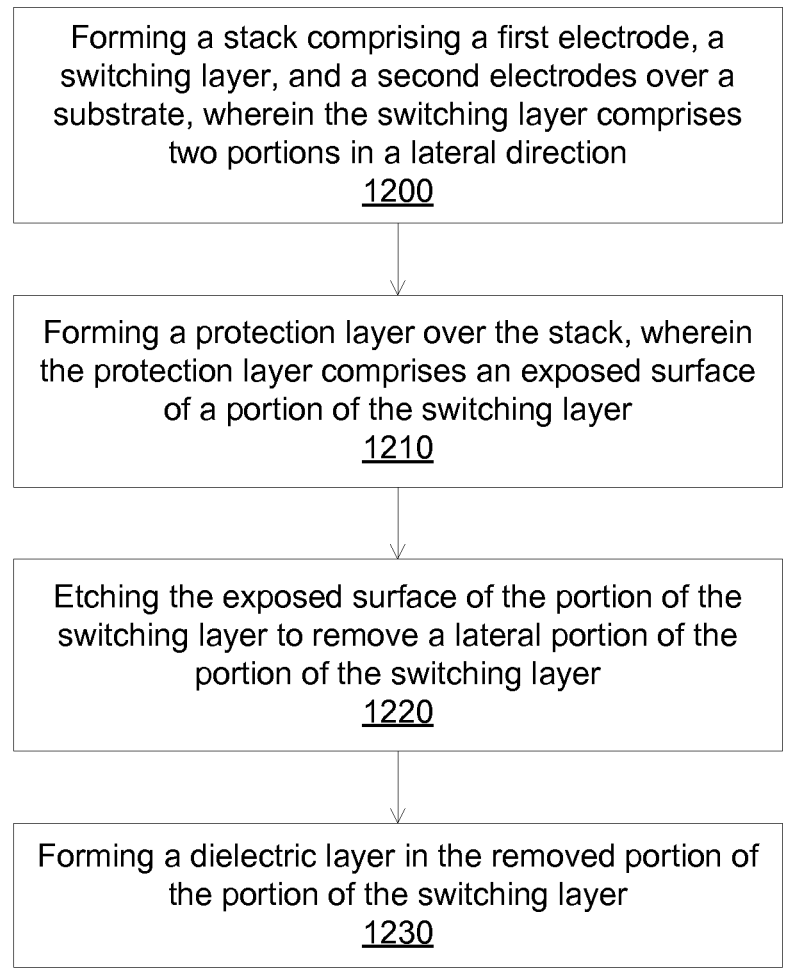
FIG. 12 illustrates a flowchart for forming a memory structure having multiple interfaces according to some embodiments.

FIG. 12 illustrates a flowchart for forming a memory structure having multiple interfaces according to some embodiments. In operation 1100, a memory stack can be formed, which can include a first insulator or dielectric layer disposed between first and second electrodes. The first dielectric layer can operable as a switching layer, and can include a metal oxide such as hafnium oxide or zirconium oxide. The first dielectric layer can have two lateral portions.

In operation 1210, a protective layer is formed over the memory stack. The protective layer can include an exposed surface of a portion of the first dielectric layer. The protective layer can be formed by a deposition process, followed by a masking process and an anisotropic etch to expose a side wall of the memory stack.

In operation 1220, the exposed surface is etched to remove a lateral portion of the first dielectric layer. The etching process can be an isotropic wet etch. The etching process can be a selective etch, which can remove the first dielectric material without affecting or etching the electrodes.

In operation 1230, a second dielectric layer is formed in the removed portion of the first dielectric layer. The formation of the second dielectric layer can be performed by a high gap fill deposition process, such as an atomic layer deposition process. The excess material outside the opening, e.g., the removed portion of the first dielectric layer, can be removed, for example, by an anisotropic etch such as a plasma etch.

FIGS. 13A-13D illustrate another process to form a memory structure according to some embodiments. A memory structure 1300 with the switching layer having one interface can be prepared, for example, by a process discussed above. The memory structure 1300 can include a switching layer 1365/1330 having interface 1370 between two lateral portions 1365 and 1330. In FIG. 13A, the memory structure 1300 is exposed to an etch process, such as an isotropic wet etch process. The isotropic wet etch can remove a portion of the lateral portions 1365 and 1330, creating openings 1332 on both sides of the dielectric layer 1365/1330.

In FIG. 13B, a dielectric layer 1367 is formed in the opening 1332. The dielectric layer 1367 can be a switching layer, which can generate a switching interface 1375 around the remaining portion of the switching layer 1365/1330. The switching interface 1375 can be formed in addition to the original interface 1370, both of which can form conductive filaments when a set voltage is applied. The dielectric layer 1367 can be a non-switching layer, and thus the switching layer can have a smaller size with the interface 1370. FIGS. 13C-13D shows top views of the memory structure, which can have a circular or rectangular shape.

Figure 14:
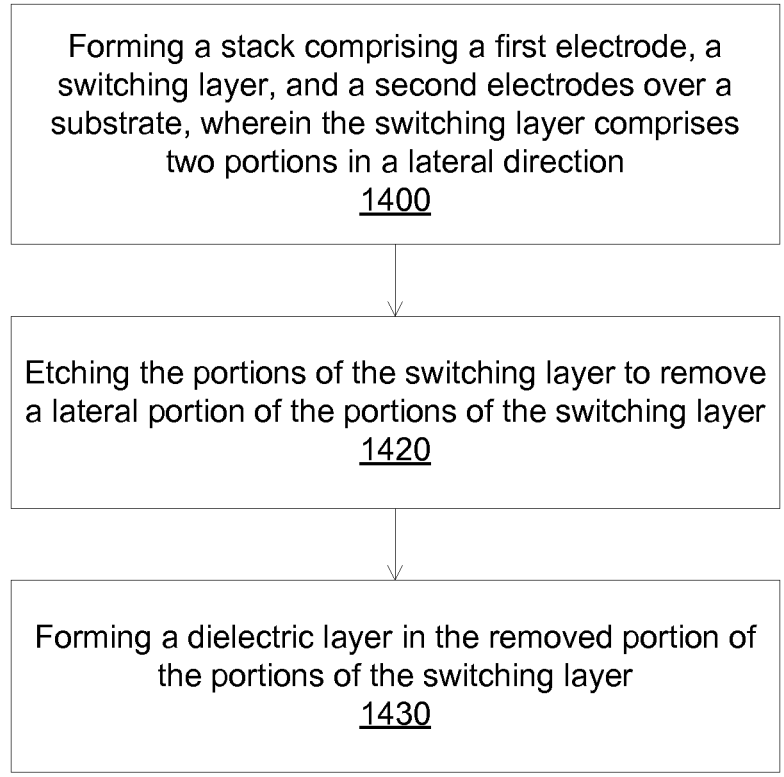
FIG. 14 illustrates another flowchart for forming a memory structure according to some embodiments.

FIG. 14 illustrates another flowchart for forming a memory structure according to some embodiments. In operation 1400, a memory stack can be formed, which can include a first insulator or dielectric layer disposed between first and second electrodes. The first dielectric layer can operable as a switching layer, and can include a metal oxide such as hafnium oxide or zirconium oxide. The first dielectric layer can have two lateral portions.

In operation 1420, the memory structure is etched to remove a lateral portion around the first dielectric layer. The etching process can be an isotropic wet etch. The etching process can be a selective etch, which can remove the first dielectric material without affecting or etching the electrodes.

In operation 1430, a second dielectric layer is formed in the removed portion of the first dielectric layer. The formation of the second dielectric layer can be performed by a high gap fill deposition process, such as an atomic layer deposition process. The excess material outside the opening, e.g., the removed portion of the first dielectric layer, can be removed, for example, by an anisotropic etch such as a plasma etch.

The second dielectric layer can be a switching layer, which can generate a switching interface around the remaining portion of the first dielectric layer. The second dielectric layer can be a non-switching layer, and thus the switching layer can have a smaller size with a surrounding non-switching layer.

In some embodiments, the ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 15:
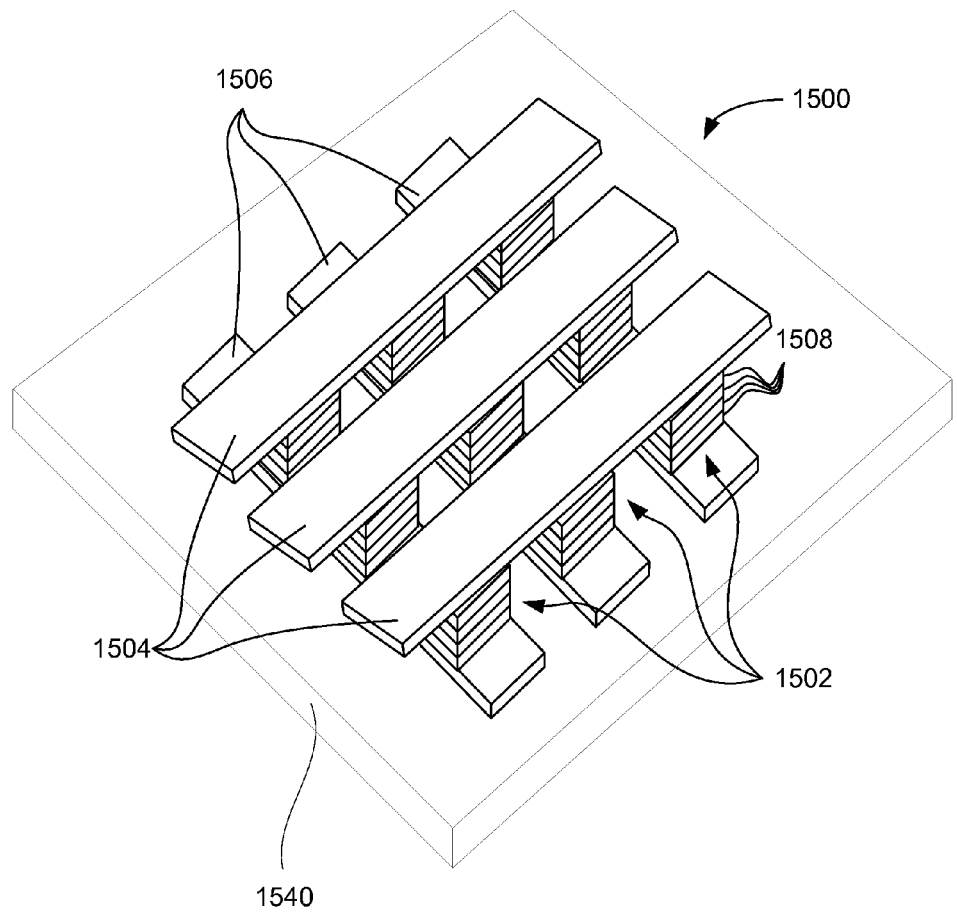
FIG. 15 illustrates a memory array of resistive switching memory elements according to some embodiments.

FIG. 15 illustrates a memory array of resistive switching memory elements according to some embodiments. Memory array 1500 may be part of a memory device or other integrated circuit. Memory array 1500 is an example of potential memory configurations; it is understood that several other configurations are possible.

Read and write circuitry may be connected to memory elements 1502 using signal lines 1504 and orthogonal signal lines 1506. Signal lines such as signal lines 1504 and signal lines 1506 are sometimes referred to as word lines and bit lines and are used to read and write data into the elements 1502 of array 1500. Also, signal lines 1504 and 1506 can be used to apply forming voltage to the memory structures 1502. Individual memory elements 1502 or groups of memory elements 1502 can be addressed using appropriate sets of signal lines 1504 and 1506. Memory element 1502 may be formed from one or more layers 1508 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 1502. For example, horizontal and vertical lines 1504 and 1506 may be connected directly to the terminals of resistive switching memory elements 1502. This is merely illustrative.

During the operation of the cross point memory array, such as a read operation, the state of a memory element 1502 can be sensed by applying a sensing voltage (i.e., a "read" voltage) to an appropriate set of signal lines 1504 and 1506. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 1504 and 1506.

In some embodiments, the memory elements 1502 can include a memory structure and a current selector or a current limiter. For example, the current selector can be fabricated on the memory structure, forming a columnar memory device, which can be placed at the cross points of the word lines and bit lines.

Figure 16:
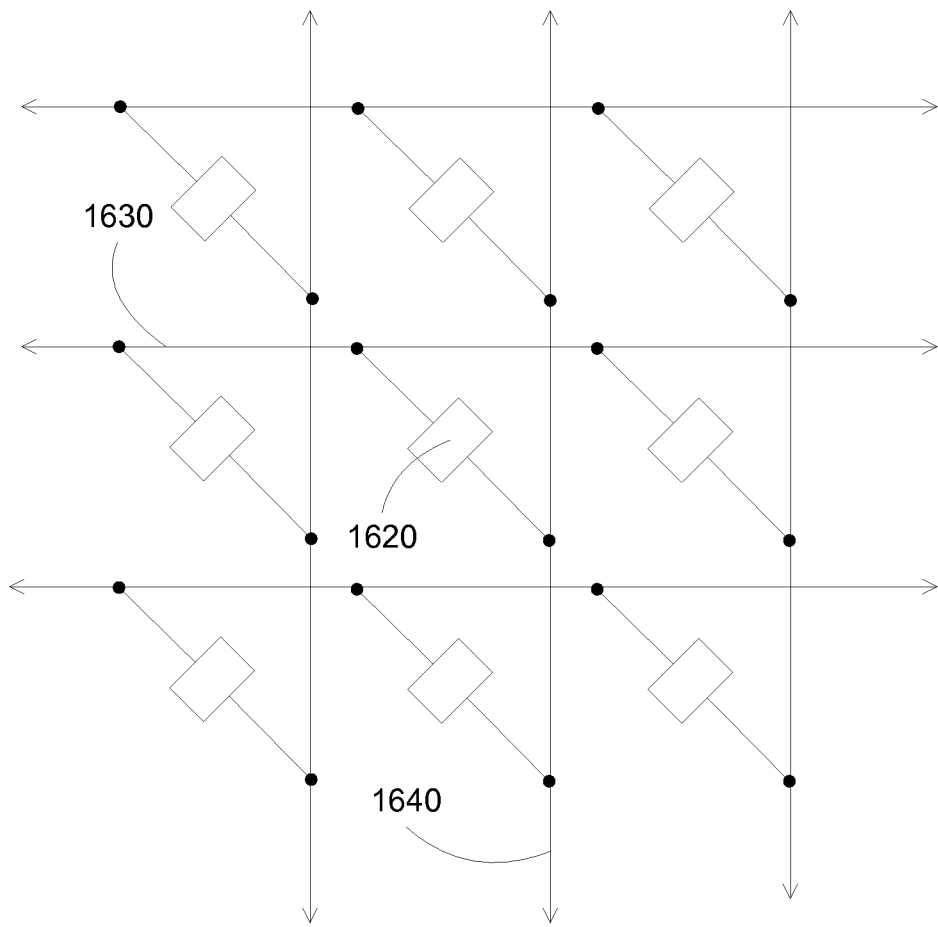
FIG. 16 illustrates a cross point memory array according to some embodiments.

FIG. 16 illustrates a cross point memory array according to some embodiments. A switching memory device 1620 can include a memory element and a current selector, which are both disposed between the electrodes 1630 and 1640. The current selector can be an intervening electrical component, disposed between electrode 1630 and memory element, or between the electrode 1640 and memory element 1620. In some embodiments, the current selector may include two or more layers of materials that are configured to provide a selector response.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a resistive switching memory structure, the method comprising:
   providing a substrate;
   forming a first and a second electrode above the substrate;
   forming a dielectric layer between the first and second electrodes,
   wherein the dielectric layer comprises a first portion and a second portion,
   wherein the first and second portions comprise a same metal oxide material,
   wherein the first portion directly contacts both the first electrode and the second electrode,
   wherein the second portion directly contacts both the first electrode and the second electrode,
   and wherein the first portion directly contacts the second portion,
   wherein the dielectric layer is operable as a resistive switching layer.

2. A method as in claim 1 wherein the first portion and the second portion form an interface, wherein the interface forms an angled surface with the first or second electrodes.

3. A method as in claim 1 wherein the first portion and the second portion form an interface, wherein the interface forms a substantially perpendicular surface with the first or second electrodes.

4. A method as in claim 1 wherein the first portion comprises a first metal oxide material, wherein the second portion comprises a second metal oxide material, and wherein the first metal oxide is different from the second metal oxide.

5. A method as in claim 1 wherein the first and second portions have a same lateral dimension as the first or second electrode.

6. A method as in claim 1 wherein the dielectric layer further comprises a third portion interfacing with the first portion or the second portion.

7. A method as in claim 6 wherein the third portion is operable as a resistive switching layer.

8. A method as in claim 6 wherein the third portion is operable as a non resistive switching layer.

9. A resistive switching memory structure comprising:
   a substrate;
   a first and a second electrodes above the substrate;
   a dielectric layer between the first and second electrodes,
   wherein the dielectric layer comprises a first portion and a second portion,
   wherein the first and second portions comprise a same metal oxide material,
   wherein the first portion directly contacts both the first electrode and the second electrode,
   wherein the second portion directly contacts both the first electrode and the second electrode,
   and wherein the first portion directly contacts the second portion,
   wherein the dielectric layer is operable as a resistive switching layer.

10. A resistive switching memory structure as in claim 9 wherein the first portion comprises a first metal oxide material, wherein the second portion comprises a second metal oxide material, and wherein the first metal oxide is different from the second metal oxide.

11. A resistive switching memory structure as in claim 9 wherein the first and second portions have a same lateral dimension as the first or second conductive layer.

12. A resistive switching memory structure as in claim 9 wherein the dielectric layer further comprises a third portion interfacing with the first portion or the second portion.

* * * * *